(12) United States Patent
Chen et al.

(10) Patent No.: US 12,426,402 B2
(45) Date of Patent: Sep. 23, 2025

(54) DETECTION DEVICE

(71) Applicant: InnoCare Optoelectronics Corporation, Tainan (TW)

(72) Inventors: Sheng-I Chen, Tainan (TW); Hsin-Hung Lin, Tainan (TW)

(73) Assignee: InnoCare Optoelectronics Corporation, Tainan (TW)

(*) Notice: Subject to any disclaimer, the term of this patent is extended or adjusted under 35 U.S.C. 154(b) by 0 days.

(21) Appl. No.: 18/430,603

(22) Filed: Feb. 1, 2024

(65) Prior Publication Data
US 2024/0304733 A1 Sep. 12, 2024

(30) Foreign Application Priority Data
Mar. 7, 2023 (TW) ................................ 112108189

(51) Int. Cl.
*H10F 77/00* (2025.01)
*H10F 30/20* (2025.01)
*H10F 77/20* (2025.01)

(52) U.S. Cl.
CPC ........... *H10F 77/933* (2025.01); *H10F 30/20* (2025.01); *H10F 77/206* (2025.01)

(58) Field of Classification Search
CPC ..... H01L 31/10; H10F 77/933; H10F 77/206; H10F 30/20; H10F 39/10
See application file for complete search history.

(56) References Cited

U.S. PATENT DOCUMENTS

| | | | |
|---|---|---|---|
| 5,917,210 A | 6/1999 | Huang et al. | |
| 2016/0071986 A1* | 3/2016 | Yamashita | H01L 27/14687 348/307 |
| 2019/0115385 A1* | 4/2019 | Moriwaki | H01L 31/105 |
| 2020/0091246 A1* | 3/2020 | Li | H01L 27/1225 |
| 2022/0383655 A1* | 12/2022 | Hao | G06V 40/1318 |
| 2023/0387177 A1* | 11/2023 | Nakazawa | H01L 27/14692 |
| 2024/0277238 A1* | 8/2024 | Kim | A61B 5/6898 |

FOREIGN PATENT DOCUMENTS

CN 109411335 3/2019

* cited by examiner

*Primary Examiner* — Thanh Luu
(74) *Attorney, Agent, or Firm* — JCIPRNET

(57) ABSTRACT

A detection device, including a substrate, a switch element, a photosensitive element, and a planarization layer, is provided. The switch element is disposed on the substrate. The photosensitive element includes a bottom electrode, a top electrode, and a first semiconductor disposed between the bottom electrode and the top electrode. The planarization layer is disposed between the bottom electrode and the switch element. The bottom electrode is coupled to the switch element.

12 Claims, 5 Drawing Sheets

DETECTION DEVICE

CROSS-REFERENCE TO RELATED APPLICATION

This application claims the priority benefit of Taiwan application serial no. 112108189, filed on Mar. 7, 2023. The entirety of the above-mentioned patent application is hereby incorporated by reference herein and made a part of this specification.

BACKGROUND

Technical Field

The disclosure relates to an electronic device, and more particularly to a detection device.

Description of Related Art

In a detection device provided with a switch element and a photosensitive element, due to the configuration of a film layer in the switch element, the surface feature of the region where the switch element is disposed is relatively uneven, making it difficult to dispose the photosensitive element above the switch element, which causes the photosensitive element to have a relatively low fill factor.

In addition, the configuration of a metal layer in the switch element does not completely cover a semiconductor in the switch element, making it easy for hydrogen ions generated when forming an insulating layer using chemical vapor deposition to diffuse into the semiconductor in the switch element, which causes the reliability of the detection device to be reduced.

SUMMARY

The disclosure provides a detection device, wherein a photosensitive element has a higher fill factor and the detection device has a higher reliability.

According to an embodiment of the disclosure, a detection device includes a substrate, a switch element, a photosensitive element, and a planarization layer. The switch element is disposed on the substrate. The photosensitive element includes a bottom electrode, a top electrode, and a first semiconductor disposed between the bottom electrode and the top electrode. The planarization layer is disposed between the bottom electrode and the switch element. The bottom electrode is coupled to the switch element.

According to an embodiment of the disclosure, a detection device includes a substrate, a photosensitive element, and a switch element. The photosensitive element is disposed on the substrate and includes a top electrode and a first semiconductor. The switch element is disposed on the substrate and includes a gate, a second semiconductor, a source, and a drain. The first semiconductor is coupled to the switch element. In a cross-sectional direction of the detection device, the first semiconductor of the photosensitive element does not overlap with the second semiconductor of the switch element. The gate, the source, and the drain of the switch element belong to a same conductor layer.

Based on the above, the planarization layer in the detection device of an embodiment of the disclosure is disposed between the bottom electrode of the photosensitive element and the switch element, and the photosensitive element may be configured to overlap with the switch element in a top view direction of the substrate through using the planarization layer with higher flatness to increase the surface area of the photosensitive element in the top view direction of the substrate, so as to have a higher fill factor.

Based on the above, the first semiconductor of the photosensitive element does not overlap with the second semiconductor of the switch element in the detection device of an embodiment of the disclosure, and the bottom electrode of the photosensitive element and the source and the drain of the switch element belong to the same layer, which can simplify the manufacturing process of the detection device to reduce the manufacturing cost.

DETAILED DESCRIPTION OF DISCLOSED EMBODIMENTS

Figure 1:
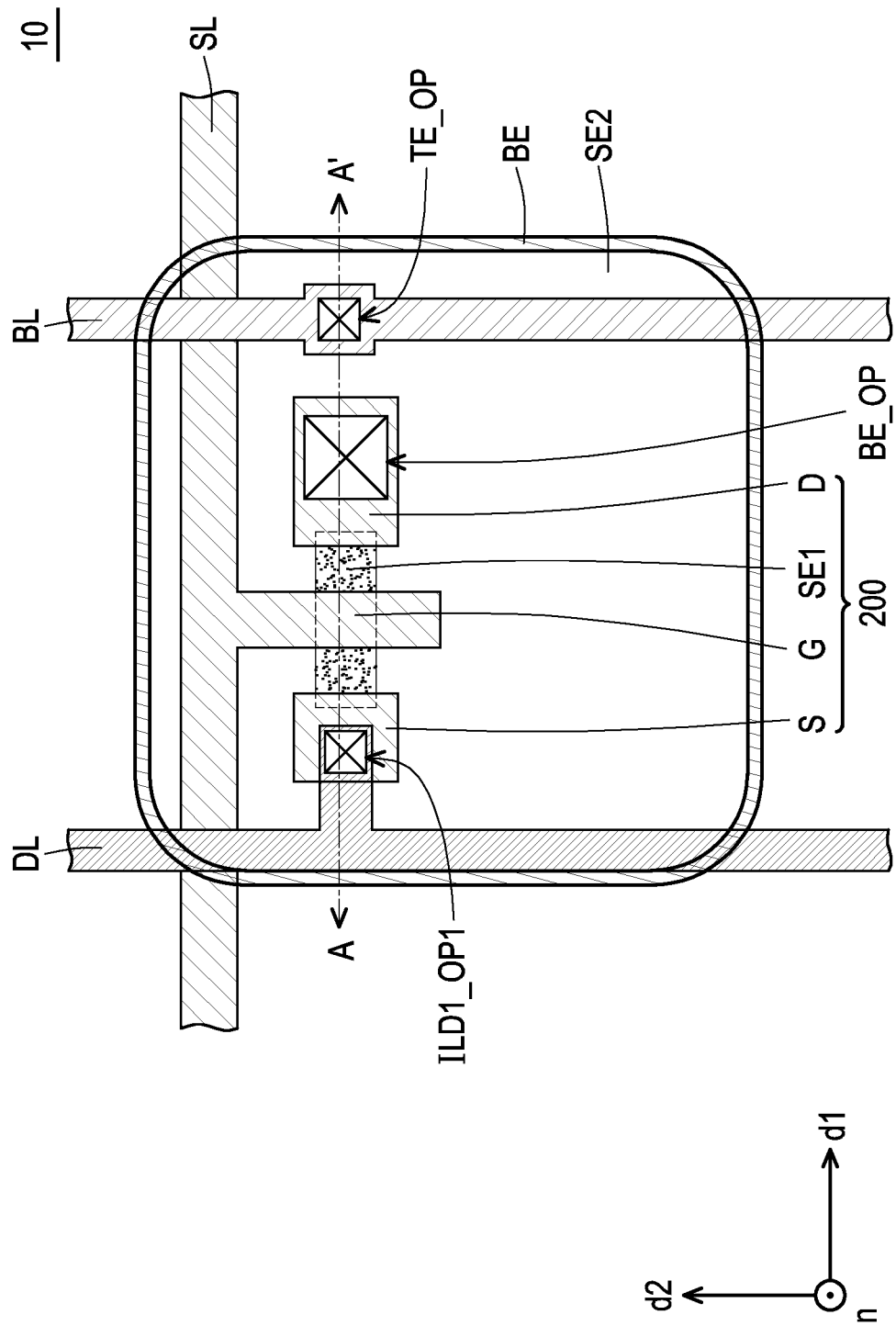
FIG. 1 is a schematic partial top view of a detection device according to an embodiment of the disclosure.

The disclosure may be understood by referring to the following detailed description in conjunction with the drawings. It should be noted that in order to facilitate the understanding by the reader and the brevity of the drawings, multiple drawings in the disclosure only depict a part of an electronic device, and specific elements in the drawings are not drawn according to actual scale. In addition, the number and the size of each element in the drawings are for illustration only and are not intended to limit the scope of the disclosure.

Throughout the specification and the appended claims of the disclosure, certain terms may be used to refer to specific elements. It should be understood by persons skilled in the art that electronic device manufacturers may refer to the same element by different names. The disclosure does not intend to distinguish between elements with the same function but different names. In the following specification and claims, terms such as "including", "containing", and "having" are open-ended terms, so the terms should be interpreted as "containing but not limited to . . . ". Therefore, when the terms "including", "containing", and/or "having" are used in the description of the disclosure, the terms designate the presence of a corresponding feature, region, step, operation, and/or component, but do not exclude the presence of one or more corresponding features, regions, steps, operations, and/or components.

Directional terms such as "upper", "lower", "front", "rear", "left", and "right" mentioned in the disclosure are only directions with reference to the drawings. Therefore, the used directional terms are used to illustrate, but not to limit, the disclosure. In the drawings, each drawing illustrates the general characteristics of a method, a structure, and/or a material used in a specific embodiment. However, the drawings should not be construed to define or limit the scope or nature covered by the embodiments. For example, for clarity, relative sizes, thicknesses, and positions of various film layers, regions, and/or structures may be reduced or enlarged.

When a corresponding component (for example, a film layer or a region) is referred to as being "on another component", the component may be directly on the other component or there may be another component between the two. On the other hand, when a component is referred to as being "directly on another component", there is no component between the two. Also, when a component is referred to as being "on another component", the two have a top-down relationship in the top view direction, and the component may be above or below the other component, and the top-down relationship depends on the orientation of a device.

The terms "about", "equal", "equivalent", "same", "substantially", or "roughly" are generally interpreted as within 20% of a given value or range or interpreted as within 10%, 5%, 3%, 2%, 1%, or 0.5% of the given value or range. In addition, the terms "a given range is between a first value and a second value" and "the given range falls within a range from the first value to the second value" mean that the given range includes the first value, the second value, and other values in between.

Ordinal numbers such as "first" and "second" used in the specification and the claims are used to modify elements, and the terms do not imply and represent that the element(s) have any previous ordinal numbers, nor do they represent the order of a certain element and another element or the order of a manufacturing method. The use of the ordinal numbers is only to clearly distinguish between an element with a certain name and another element with the same name. The claims and the specification may not use the same terms, whereby a first component in the specification may be a second component in the claims.

It should be noted that in the following embodiments, features in several different embodiments may be replaced, recombined, and mixed to complete other embodiments without departing from the spirit of the disclosure. As long as the features of the embodiments do not violate the spirit of the invention or conflict with each other, the features may be arbitrarily mixed and matched for use.

Electrical connection or coupling described in the disclosure may refer to direct connection or indirect connection. In the case of direct connection, terminals of elements on two circuits are directly connected or connected to each other by a conductor segment. In the case of indirect connection, there is a switch, a diode, a capacitor, an inductor, other suitable elements, or a combination of the above elements between the terminals of the elements on the two circuits, but not limited thereto.

In the disclosure, the measurement manner of thickness, length, and width may be by adopting an optical microscope, and the thickness may be measured by a cross-sectional image in an electron microscope, but not limited thereto. In addition, there may be a certain error in any two values or directions for comparison. If a first value is equal to a second value, it implies that there may be an error of about 10% between the first value and the second value. If a first direction is perpendicular to a second direction, an angle between the first direction and the second direction may be between 80 degrees and 100 degrees; and if the first direction is parallel to the second direction, the angle between the first direction and the second direction may be between 0 degrees and 10 degrees.

The electronic device of the disclosure may include a detection device, a display device, an antenna device (for example, a liquid crystal antenna), a light emitting touch device, a splicing device, other devices with suitable functions, or a combination of the devices with the above functions, but not limited thereto. The electronic device includes a rollable or flexible electronic device, but not limited thereto. The electronic device may include, for example, liquid crystal, a light emitting diode (LED), a photodiode, quantum dot (QD), fluorescence, phosphor, other suitable materials, or a combination thereof. The electronic device may include an electronic element. The electronic element may include a passive element and an active element, such as a capacitor, a resistor, an inductor, a diode, and a transistor. The diode may include a light emitting diode or a photodiode. The light emitting diode may include, for example, an organic light emitting diode (OLED), a mini LED, a micro LED, or a quantum dot LED (for example, QLED or QDLED), other suitable electronic materials, or any permutation and combination of the above materials, but not limited thereto. It should be noted that the electronic device may be any permutation and combination thereof, but not limited thereto. In addition, the shape of the electronic device may be rectangular, circular, polygonal, a shape with curved edges, or other suitable shapes. The electronic device may have peripheral systems such as a driving system, a control system, a light source system, and a rack system to support the display device or the splicing device. It should be noted that the electronic device may be any permutation and combination thereof, but not limited thereto. The electronic device may include multiple parts, and at least two of the parts may be assembled to form a composite object. Hereinafter, the detection device will be used as the electronic device to illustrate the disclosure, but the disclosure is not limited thereto.

Exemplary embodiments of the disclosure are exemplified below, and the same reference numerals are used in the drawings and description to refer to the same or similar parts.

Figure 2:
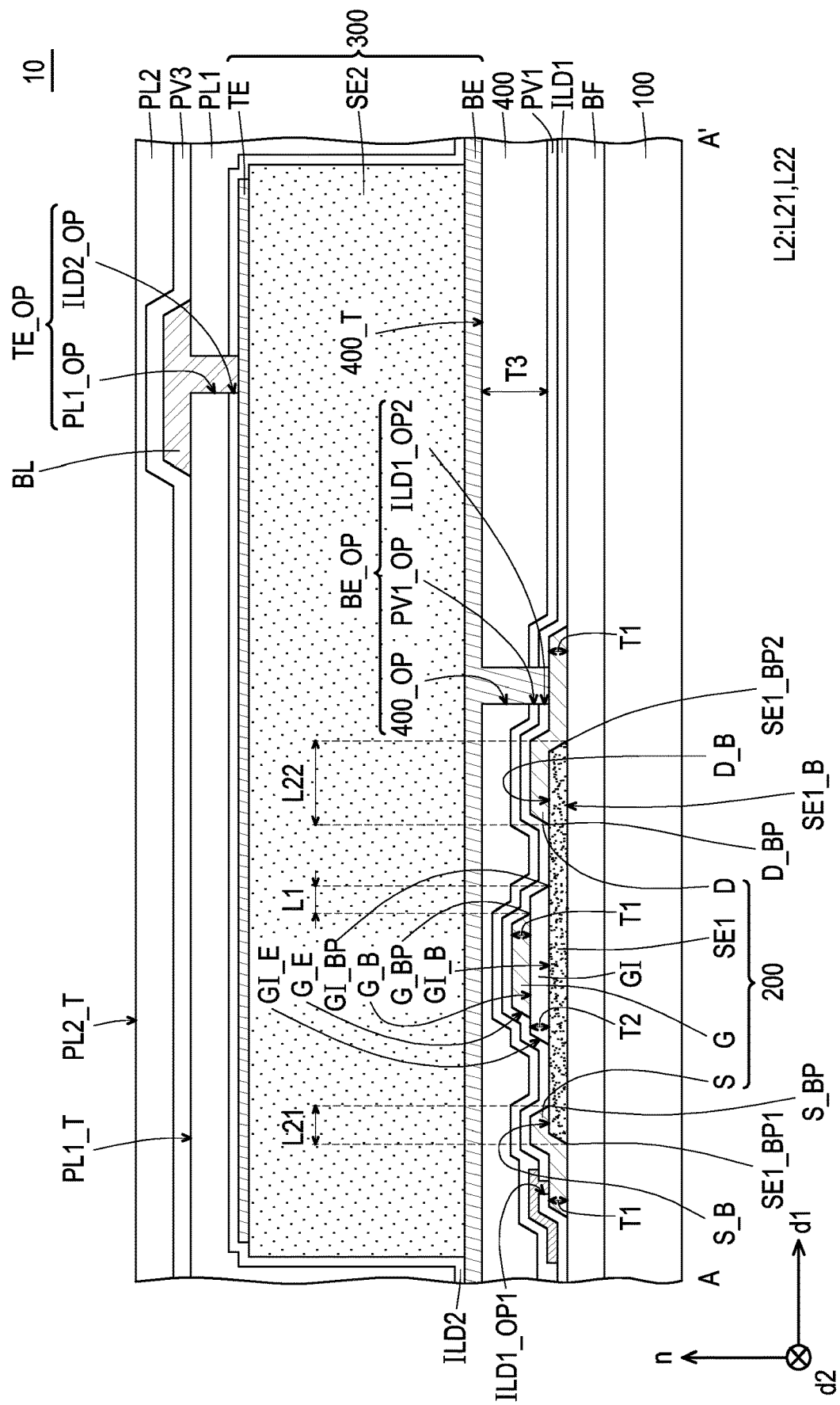
FIG. 2 is a schematic partial cross-sectional view of an embodiment according to a section line A-A' of FIG. 1.

FIG. 1 is a schematic partial top view of a detection device according to an embodiment of the disclosure, and FIG. 2 is a schematic partial cross-sectional view of an embodiment according to a section line A-A' of FIG. 1.

Please refer to FIG. 1 and FIG. 2 at the same time. A detection device 10 of the embodiment includes a substrate 100, a switch element 200, a photosensitive element 300, and a planarization layer 400.

The material of the substrate 100 may include a hard material, a soft material, or a combination thereof. For example, the material of the substrate 100 may include quartz, sapphire, polymethyl methacrylate (PMMA), polycarbonate (PC), polyimide (PI), polyethylene terephthalate (PET), other suitable materials, or a combination of the above materials, but the disclosure is not limited thereto.

The switch element 200 is, for example, disposed on the substrate 100. In some embodiments, the switch element 200 includes a gate G, a source S, a drain D, and a semiconductor SE1, but the disclosure is not limited thereto. The gate G is, for example, disposed on the substrate 100. The material of the gate G may include, for example, molybdenum (Mo), titanium (Ti), tantalum (Ta), niobium (Nb), hafnium (Hf), nickel (Ni), chromium (Cr), cobalt (Co), zirconium (Zr), tungsten (W), aluminum (Al), copper (Cu), silver (Ag), other suitable metals, or an alloy or a combination of the above materials, but the disclosure is not limited thereto. In the embodiment, the material of the gate G includes molybdenum (Mo), titanium (Ti), aluminum (Al), molybdenum nitride (MoN), or a combination thereof. In some embodiments, a maximum thickness T1 of the gate G may be between 500 angstroms (Å) and 1500 angstroms, but the disclosure is not limited thereto.

The semiconductor SE1 is, for example, disposed on the substrate 100. In the embodiment, the semiconductor SE1 is disposed between the substrate 100 and the gate G, but not limited thereto. The semiconductor SE1 may, for example, at least partially overlap with the gate G in a normal direction n of the substrate 100, but the disclosure is not limited thereto. In the embodiment, the material of the semiconductor SE1 includes an oxide semiconductor, an amorphous silicon semiconductor, a polysilicon semiconductor, other suitable semiconductor materials, or a combination of the above materials, but the disclosure is not limited thereto. In an embodiment, the material of the semiconductor SE1 may include indium gallium zinc oxide (IGZO), but the disclosure is not limited thereto. Since the material of the semiconductor SE1 of the embodiment includes the oxide semiconductor, the oxide semiconductor enables the switch element 200 to have higher electron mobility than silicon. Moreover, the oxide semiconductor has a relatively greater energy band gap than silicon, so the switch element 200 may have a lower leakage current in a cut-off state. Based on this, the electrical properties of the detection device of the embodiment can be increased by including the oxide semiconductor in the material of the semiconductor SE1.

In some embodiments, a gate insulating layer GI may be disposed between the semiconductor SE1 and the gate G. In detail, the gate insulating layer GI may be, for example, a block structure and at least partially overlap with the gate G in the normal direction n of the substrate 100. In the embodiment, an end portion GI_E of the gate insulating layer GI is close to an adjacent end portion G_E of the gate G, and the end portion GI_E of the gate insulating layer GI protrudes from the adjacent end portion G_E of the gate G. In detail, the end portion GI_E of the gate insulating layer GI protrudes from the adjacent end portion G_E of the gate G, for example, in a cross-sectional direction of the detection device 10. Taking FIG. 2 as an example, the end portion GI_E of the gate insulating layer GI protrudes from the adjacent end portion G_E of the gate G in a first direction d1. In other words, the length of the gate insulating layer GI in the first direction d1 is greater than the length of the gate G in the first direction d1, wherein the first direction d1 is perpendicular to the normal direction n of the substrate 100, but the disclosure is not limited thereto. In some other embodiments, the end portion GI_E of the gate insulating layer GI may protrude from the adjacent end portion G_E of the gate G in a second direction d2, wherein the second direction d2 may be perpendicular to the first direction d1 and the normal direction n of the substrate 100.

In the embodiment, in the cross-sectional direction of the detection device 10, a part of the end portion GI_E of the gate insulating layer GI protruding from the adjacent end portion G_E of the gate G has a length L1, wherein the length L1 is between 0.5 microns (μm) and 2.0 microns. In the embodiment, the length L1 is a distance from an endpoint GI_BP of a bottom surface GI_B of the gate insulating layer GI to an endpoint G_BP of a bottom surface G_B of the gate G in the cross-sectional direction of the detection device 10. Taking FIG. 2 as an example, the length L1 may be the distance from the endpoint GI_BP of the bottom surface GI_B of the gate insulating layer GI to the endpoint G_BP of the bottom surface G_B of the gate G in the first direction d1, but the disclosure is not limited thereto. Through enabling the protruding part of the end portion GI_E of the gate insulating layer GI to have the range of the length L1, the range in which hydrogen ions generated when forming an insulating layer ILD1 to be introduced later through chemical vapor deposition diffuse into the semiconductor SE1 may be adjusted. In other words, a region of the semiconductor SE1 covered by the gate insulating layer GI but not covered by the gate G in the normal direction n of the substrate 100 may form a lightly doped region, so as to improve the reliability of the detection device 10.

In some embodiments, a minimum thickness T2 of the gate insulating layer GI may be between 500 angstroms and 2000 angstroms, but the disclosure is not limited thereto. The material of the gate insulating layer GI may include, for example, an inorganic material (for example, silicon oxide, silicon nitride, aluminum oxide, or a stacked layer of at least two of the above materials), but the disclosure is not limited thereto.

In the embodiment, the source S and the drain D are disposed on the semiconductor SE1 and are separated from each other, and are in direct contact with and coupled to the semiconductor SE1, but the disclosure is not limited thereto. In the embodiment, the source S, the drain D, and the gate G are formed by the same conductor layer, so the materials of the source S and the drain D may be, for example, the same as the material of the gate G. Through forming the gate G, the source S, and the drain D by the same conductor layer, the size of the switch element 200 in the normal direction n of the substrate 100 may be, for example, reduced, and the flatness of a film layer disposed above the switch element 200 may be, for example, improved. In addition, in some embodiments, the maximum thickness T1 of each of the source S and the drain D and the maximum thickness T1 of the gate G may be between 500 angstroms and 1500 angstroms, but the disclosure is not limited thereto.

In the embodiment, in the cross-sectional direction of the detection device 10, at least one of the source S and the drain D overlaps with the semiconductor SE1 by a length L2, wherein the length L2 is between 0.5 microns and 4 microns. Taking FIG. 2 as an example, in an embodiment, the length L21 may be the length of the overlap between the source S and the semiconductor SE1 and is a maximum distance from an endpoint S_BP of a bottom surface S_B of the source S to an endpoint SE1_BP1 of a bottom surface SE1_B of the semiconductor SE1 in the cross-sectional direction of the detection device 10. In another embodiment, the length L22 may be the length of the overlap between the drain D and the semiconductor SE1 and is a maximum distance from an endpoint D_BP of a bottom surface D_B of the drain D to an endpoint SE1_BP2 of the bottom surface SE1_B of the semiconductor SE1 in the cross-sectional direction of the detection device 10. The length L21 may be the maximum distance from the endpoint S_BP of the bottom surface S_B of the source S to the endpoint SE1_BP1 of the bottom surface SE1_B of the semiconductor SE1 in the first direction d1, and the length L22 may be the maximum distance from the endpoint D_BP of the bottom surface D_B of the drain D to the endpoint SE1_BP2 of the bottom surface SE1_B of the semiconductor SE1 in the first direction d1, but the disclosure is not limited thereto. Through enabling the length of the overlap between at least one of the source S and the drain D and the semiconductor SE1 to be within the above-mentioned range, an interface between at least one of the source S and the drain D and the semiconductor SE1 may form a low-impedance region to have a lower contact impedance. In an embodiment, when the semiconductor SE1 includes IGZO, since the material of at least one of the source S and the drain D includes molybdenum, titanium, aluminum, or a combination thereof, at least one of the source S and the drain D may react with IGZO in the semiconductor SE1 to form molybdenum, titanium, and/or aluminum oxides on the interface between at least one of the source S and the drain D and the semiconductor SE1, so that oxygen vacancies of the semiconductor SE1 increase accordingly, and valence electrons in the metal close to the oxygen vacancies may be released without being attracted by oxygen, so as to improve the conductivity of the semiconductor SE1.

The photosensitive element 300 is, for example, disposed on the substrate 100 and coupled to the switch element 200. In the embodiment, the photosensitive element 300 includes a bottom electrode BE, a top electrode TE, and a semiconductor SE2.

In the embodiment, the bottom electrode BE is disposed on the switch element 200, and in the top view of the detection device 10, the bottom electrode BE overlaps with the switch element 200. For example, the bottom electrode BE may overlap with the switch element 200 in the normal direction n of the substrate 100. The bottom electrode BE and the top electrode TE may include, for example, transparent conductive materials such as indium tin oxide (ITO), but the disclosure is not limited thereto. The photosensitive element 300 may be, for example, coupled to the switch element 200 through the bottom electrode BE. In detail, the semiconductor SE2 of the photosensitive element 300 may receive light rays and generate carriers (for example, electrons and/or electron holes). When the switch element 200 is not turned on, the carriers are stored in the photosensitive element 300. When the switch element 200 is turned on, the carriers stored in the photosensitive element 300 may be, for example, transmitted to a processing circuit (not shown) via a data line DL (reading line) to be introduced later coupled to the bottom electrode BE and the switch element 200, thereby implementing the function of light detection. In addition, the top electrode TE is, for example, coupled to a voltage line BL to be introduced later.

The semiconductor SE2 is, for example, disposed between the bottom electrode BE and the top electrode TE in the normal direction n of the substrate 100. In some embodiments, the semiconductor SE2 may include a first layer (not shown), an intrinsic layer (not shown), and a second layer (not shown), and the first layer, the intrinsic layer, and the second layer are, for example, stacked in this order in the normal direction n of the substrate 100, but the disclosure is not limited thereto. The bottom electrode BE and the top electrode TE may be, for example, respectively coupled to the first layer and the second layer of the semiconductor SE2.

In the embodiment, the material of the semiconductor SE2 of the photosensitive element 300 includes amorphous silicon, but the disclosure is not limited thereto. In other embodiments, the semiconductor SE2 may include a monocrystalline material or a polycrystalline material. In some embodiments, the semiconductor SE2 of the photosensitive element 300 may be formed through chemical vapor deposition and lithography etching.

The planarization layer 400 is, for example, disposed between the bottom electrode BE of the photosensitive element 300 and the switch element 200. In the embodiment, the planarization layer 400 partially covers the drain D of the switch element 200. In detail, the planarization layer 400 has an opening 400_OP exposing a part of the drain D, wherein the bottom electrode BE of the photosensitive element 300 is disposed on the planarization layer 400 and may be coupled to the drain D of the switch element 200 through the opening 400_OP, but the disclosure is not limited thereto. In some embodiments, a thickness T3 of the planarization layer 400 may be between 1 micron and 2 microns, but the disclosure is not limited thereto. The material of the planarization layer 400 may be, for example, an organic material, such as polyimide resin, epoxy resin, acrylic resin, or a combination thereof, and a top surface 400_T of the planarization layer 400 may have better flatness, so that a film layer to be formed later may be formed on the top surface 400_T of the planarization layer 400. Based on this, the photosensitive element 300 may be disposed on the planarization layer 400, and overlap with the switch element 200 in the normal direction n of the substrate 100, so that the surface area of the photosensitive element 300 in the normal direction n of the substrate 100 may be increased to have a higher fill factor (FF), so as to improve the photoelectric conversion efficiency of the photosensitive element 300.

In some embodiments, the detection device 10 also includes a buffer layer BF.

The buffer layer BF is, for example, disposed on substrate 100. In the embodiment, the buffer layer BF is disposed between the semiconductor SE1 and the substrate 100, but the disclosure is not limited thereto. The buffer layer BF may be a single-layer structure or a multi-layer structure, and the material of the buffer layer BF may include, for example, an inorganic material (for example, silicon oxide, silicon nitride, silicon oxynitride, or a stacked layer structure of at least two of the above materials), but the disclosure is not limited thereto.

In some embodiments, the detection device 10 also includes an insulating layer PV1.

The insulating layer PV1 is, for example, disposed between the planarization layer 400 and the switch element 200. In the embodiment, the insulating layer PV1 partially covers the drain D of the switch element 200. In detail, the insulating layer PV1 also has an opening PV1_OP exposing a part of the drain D, that is, the opening PV1_OP of the insulating layer PV1 may be communicated with the opening 400_OP of the planarization layer 400, but the disclosure is not limited thereto. The material of the insulating layer PV1 may include, for example, an inorganic material (for example, silicon oxide, silicon nitride, silicon oxynitride, or a stacked layer of at least two of the above materials), an organic material (for example, polyimide resin, epoxy resin, or acrylic resin), or a combination thereof, but the disclosure is not limited thereto.

In some embodiments, the detection device 10 also includes a scanning line SL, the data line DL, and the insulating layer ILD1.

The scanning line SL is, for example, disposed on the substrate 100 and coupled to the gate G of the switch element 200, wherein the scanning line SL may be, for example, used to provide a scanning signal to the corresponding switch element 200 to turn on the switch element 200. In some embodiments, the scanning line SL extends toward the first direction d1, but the disclosure is not limited thereto. In the embodiment, the scanning line SL, the source S, the drain D, and the gate G may be formed by the same conductor layer. Therefore, the material of the scanning line SL may be, for example, the same as the materials of the source S, the drain D, and the gate G, which will not be repeated here.

The data line DL is, for example, disposed on the substrate 100 and coupled to the source S of the switch element 200, wherein a signal (carrier) generated by the photosensitive element 300 may be transmitted to the data line DL through the source S, and the data line DL may transmit the signal (carrier) to the processing circuit (not shown). In some embodiments, the data line DL extends toward the second direction d2, but the disclosure is not limited thereto.

The insulating layer ILD1 is, for example, disposed between the insulating layer PV1 and the switch element 200. In the embodiment, the insulating layer ILD1 partially covers the source S and the drain D of the switch element 200. In detail, the insulating layer ILD1 has an opening ILD1_OP1 exposing a part of the source S and also has an opening ILD1_OP2 exposing a part of the drain D, that is, the opening ILD1_OP2 of the insulating layer ILD1 may be communicated with the opening 400_OP of the planarization layer 400 and the opening PV1_OP of the insulating layer PV1 to form an opening BE_OP, so as to jointly expose a part of the drain D, so that the bottom electrode BE of the photosensitive element 300 may be coupled to the drain D of the switch element 200 through the communicated opening BE_OP, but the disclosure is not limited thereto. In an embodiment, the opening 400_OP of the planarization layer 400, the opening PV1_OP of the insulating layer PV1, and the opening ILD1_OP2 of the insulating layer ILD1 may be formed through one manufacturing process. In another embodiment, the opening 400_OP of the planarization layer 400, the opening PV1_OP of the insulating layer PV1, and the opening ILD1_OP2 of the insulating layer ILD1 may be respectively formed through different manufacturing processes. In another embodiment, an opening of two adjacent stacked structures among the opening 400_OP of the planarization layer 400, the opening PV1_OP of the insulating layer PV1, and the opening ILD1_OP2 of the insulating layer ILD1 may be formed through one manufacturing process. For example, the opening PV1_OP of the insulating layer PV1 and the opening ILD1_OP2 of the insulating layer ILD1 may be formed through one manufacturing process, and the opening 400_OP of the planarization layer 400 is formed through another manufacturing process, but not limited thereto. The material of the insulating layer ILD1 may include, for example, an inorganic material (for example, silicon oxide, silicon nitride, silicon oxynitride, or a stacked layer of at least two of the above materials), an organic material (for example, polyimide resin, epoxy resin, or acrylic resin), or a combination thereof, but the disclosure is not limited thereto.

In some embodiments, the detection device 10 also includes the voltage line BL, an insulating layer ILD2, a planarization layer PL1, a planarization layer PL2, and an insulating layer PV3.

The voltage line BL is, for example, disposed on the substrate 100 and coupled to the photosensitive element 300, wherein the voltage line BL may be, for example, used to apply a voltage level to the photosensitive element 300. In some embodiments, the voltage line BL extends toward the second direction d2, but the disclosure is not limited thereto.

The insulating layer ILD2 is, for example, disposed between the voltage line BL and the photosensitive element 300. In the embodiment, the insulating layer ILD2 partially covers the top electrode TE of the photosensitive element 300. Specifically, the insulating layer ILD2 has an opening ILD2_OP exposing a part of the top electrode TE. The material of the insulating layer ILD2 may include, for example, an inorganic material (for example, silicon oxide, silicon nitride, silicon oxynitride, or a stacked layer of at least two of the above materials), an organic material (for example, polyimide resin, epoxy resin, or acrylic resin), or a combination thereof, but the disclosure is not limited thereto.

The planarization layer PL1 is, for example, disposed between the voltage line BL and the insulating layer ILD2.

In the embodiment, the planarization layer PL1 also partially covers the top electrode TE of the photosensitive element 300. In detail, the planarization layer PL1 has an opening PL1_OP exposing a part of the top electrode TE, that is, the opening PL1_OP of the planarization layer PL1 may be communicated with the opening ILD2_OP of the insulating layer ILD2 to form an opening TE_OP, so as to jointly expose a part of the top electrode TE, so that the voltage line BL may be coupled to the top electrode TE of the photosensitive element 300 through the communicated opening TE_OP, but the disclosure is not limited thereto. In an embodiment, the opening PL1_OP of the planarization layer PL1 and the opening ILD2_OP of the insulating layer ILD2 may be formed through one manufacturing process. In another embodiment, the opening PL1_OP of the planarization layer PL1 and the opening ILD2_OP of the insulating layer ILD2 may be formed through different manufacturing processes, but not limited thereto. The material of the planarization layer PL1 may be, for example, an organic material such as polyimide resin, epoxy resin, acrylic resin, or a combination thereof, and a top surface PL1_T of the planarization layer PL1 may have better flatness, so that the voltage line BL may be formed on the top surface PL1_T of the planarization layer PL1.

The planarization layer PL2 is, for example, disposed on the voltage line BL and covers, for example, the voltage line BL. The material of the planarization layer PL2 may be, for example, an organic material such as polyimide resin, epoxy resin, acrylic resin, or a combination thereof, and a top surface PL2_T of the planarization layer PL2 may have better flatness, so that a film layer to be formed later (for example, a scintillator, not shown in the drawings) may be formed on the top surface PL2_T of the planarization layer PL2.

The insulating layer PV3 is, for example, disposed on the voltage line BL and is, for example, disposed between the voltage line BL and the planarization layer PL2. In the embodiment, the insulating layer PV3 covers the voltage line BL, but the disclosure is not limited thereto. In addition, in the embodiment, the insulating layer PV3 may, for example, cover the photosensitive element 300 to be suitable for protecting the photosensitive element 300. The material of the insulating layer PV3 may include, for example, an inorganic material (for example, silicon oxide, silicon nitride, silicon oxynitride, or a stacked layer of at least two of the above materials), an organic material (for example, polyimide resin, epoxy resin, or acrylic resin), or a combination thereof, but the disclosure is not limited thereto.

Figure 3:
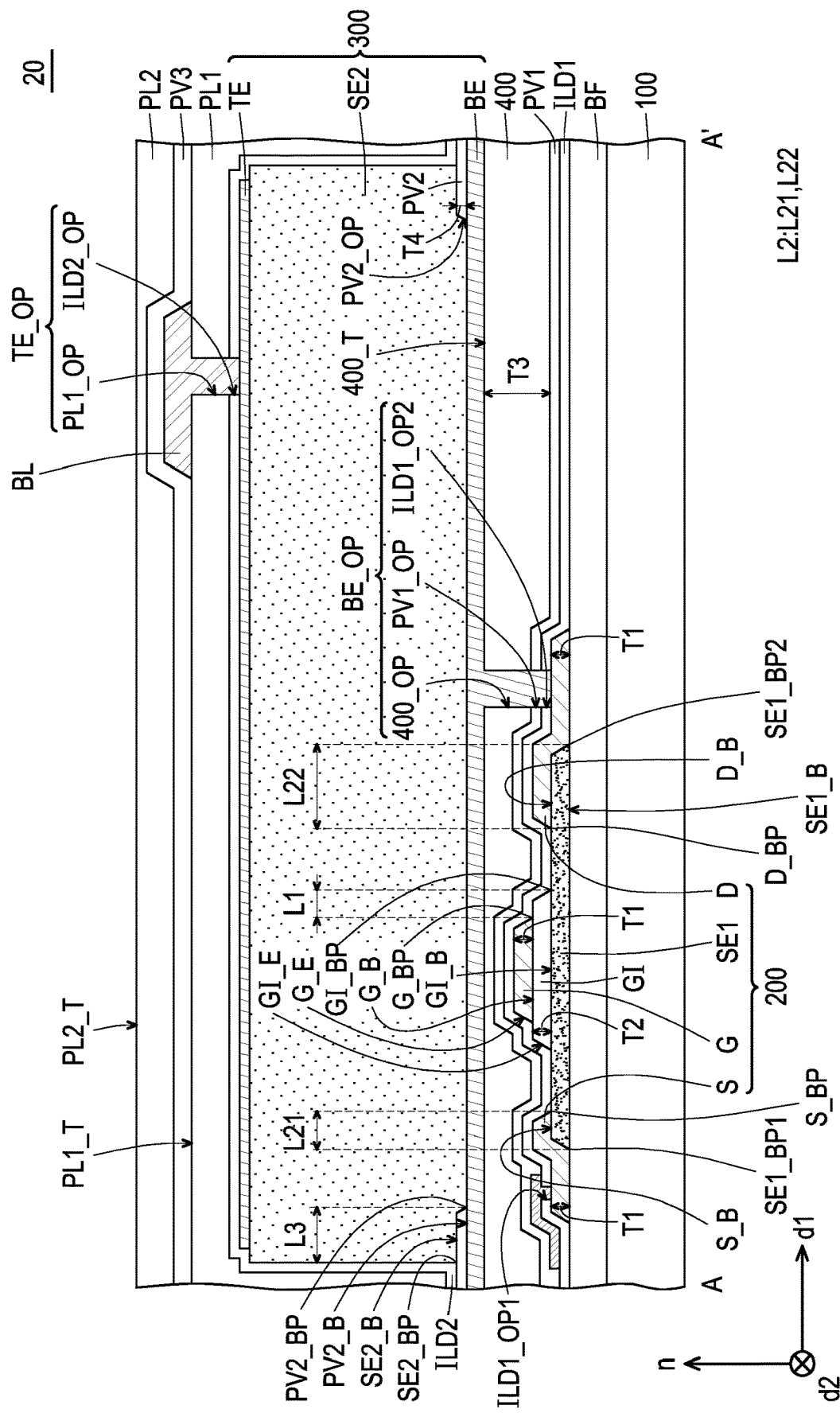
FIG. 3 is a schematic partial cross-sectional view of another embodiment according to a section line A-A' of FIG. 1.

FIG. 3 is a schematic partial cross-sectional view of another embodiment according to a section line A-A' of FIG. 1. It should be noted that the embodiment of FIG. 3 may continue to use the reference numerals and some content of the embodiment of FIG. 2, wherein the same or similar reference numerals are adopted to indicate the same or similar elements and the description of the same technical content is omitted.

Please refer to FIG. 3. The main difference between a detection device 20 of the embodiment and the detection device 10 is that in the embodiment, the detection device 20 also includes an insulating layer PV2.

The insulating layer PV2 is, for example, disposed between the semiconductor SE2 and the bottom electrode BE of the photosensitive element 300 and exposes a part of the bottom electrode BE. In detail, the insulating layer PV2 has an opening PV2_OP exposing a part of the bottom electrode BE, wherein the semiconductor SE2 of the photosensitive element 300 is disposed on the insulating layer PV2 and may be coupled to the bottom electrode BE through the opening PV2_OP, but the disclosure is not limited thereto.

In the embodiment, in the cross-sectional direction of the detection device 20, the insulating layer PV2 overlaps with the semiconductor SE2 of the photosensitive element 300 by a length L3, wherein the length L3 may be between 0.5 microns and 6 microns, between 0.5 microns and 5 microns, between 1 micron and 5 microns, or between 1 micron and 4 microns. In the embodiment, the length L3 is a distance from an endpoint PV2_BP of a bottom surface PV2_B of the insulating layer PV2 to an endpoint SE2_BP of a bottom surface SE2_B of the semiconductor SE2 in the cross-sectional direction of the detection device 20. Taking FIG. 3 as an example, the length L3 may be the distance from the endpoint PV2_BP of the bottom surface PV2_B of the insulating layer PV2 to the endpoint SE2_BP of the bottom surface SE2_B of the semiconductor SE2 in the first direction d1, but the disclosure is not limited thereto. Through overlapping the insulating layer PV2 with the semiconductor SE2 of the photosensitive element 300 by the above-mentioned length range, the insulating layer PV2 may be suitable as an etch stop layer when forming the semiconductor SE2 of the photosensitive element 300 by etching, which may reduce the possibility of damaging a part of the bottom electrode BE below the semiconductor SE2 due to etching, so as to reduce the sputtering of impurities (for example, metal ions) generated due to etching onto a side surface of the semiconductor SE2, thereby reducing the possibility of a leakage path being generated on the side surface of the semiconductor SE2, so as to improve the reliability of the detection device 20.

In some embodiments, a thickness T4 of the insulating layer PV2 may be between 1000 angstroms and 3000 angstroms, but the disclosure is not limited thereto. The material of the insulating layer PV2 may include, for example, an inorganic material (for example, silicon oxide, silicon nitride, aluminum oxide, or a stacked layer of at least two of the above materials), but the disclosure is not limited thereto.

Figure 4:
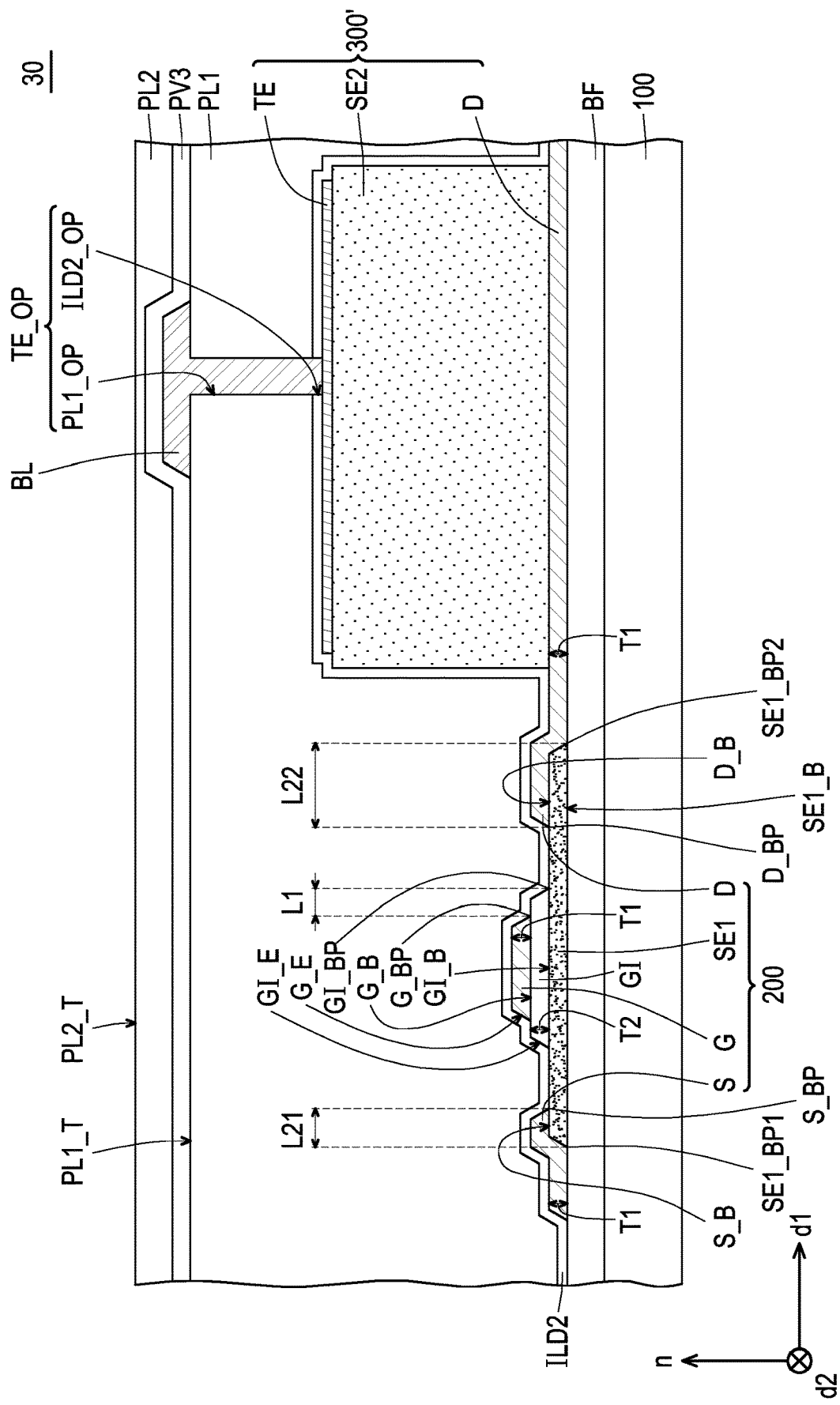
FIG. 4 is a schematic partial cross-sectional view of a detection device according to another embodiment of the disclosure.

FIG. 4 is a schematic partial cross-sectional view of a detection device according to another embodiment of the disclosure. It should be noted that the embodiment of FIG. 4 may continue to use the reference numerals and some content of the embodiment of FIG. 2, wherein the same or similar reference numerals are adopted to indicate the same or similar elements and the description of the same technical content is omitted.

Please refer to FIG. 4. The main difference between a detection device 30 of the embodiment and the detection device 10 is that (1) in the cross-sectional direction of the detection device 30, the semiconductor SE2 of a photosensitive element 300' does not overlap with the semiconductor SE1 of the switch element 200; and (2) the gate G, the source S, and the drain D of the switch element 200 are formed by the same conductor layer, and the drain D may extend to be coupled to the semiconductor SE2 of the photosensitive element 300' to serve as a bottom electrode of the photosensitive element 300'.

In the embodiment, the detection device 30 does not include the insulating layer PV1 and the planarization layer 400 compared to the detection device 10 of FIG. 2, so the configuration of insulating layers and the number of masks for patterning the insulating layers can be reduced. In addition, through not overlapping the semiconductor SE2 of the photosensitive element 300' with the semiconductor SE1 of the switch element 200 in the cross-sectional direction of the detection device 30, the possibility that the photosensitive element 300' is affected by the relatively uneven surface feature above the switching element 200 may be reduced, so as to improve the yield of the detection device 30.

In addition, in the embodiment, the gate G, the source S, and the drain D of the switch element 200 belong to the same conductor layer, and the length of the drain D may be controlled to serve as the bottom electrode of the photosensitive element 300', which can reduce the configuration of conductor layers and the number of masks for patterning the conductor layers, so as to also reduce the manufacturing cost.

In addition, in the embodiment, in the cross-sectional direction of the detection device 30, reference may be made to the content of FIG. 2 for the ranges of the length L1 of the part of the gate insulating layer GI protruding from the gate G, the length L21 which is the maximum distance from the endpoint S_BP of the bottom surface S_B of the source S to the endpoint SE1_BP1 of the bottom surface SE1_B of the semiconductor SE1, and the length L22 which is the maximum distance from the endpoint D_BP of the bottom surface D_B of the drain D to the endpoint SE1_BP2 of the bottom surface SE1_B of the semiconductor SE1, which will not be repeated here.

Figure 5:
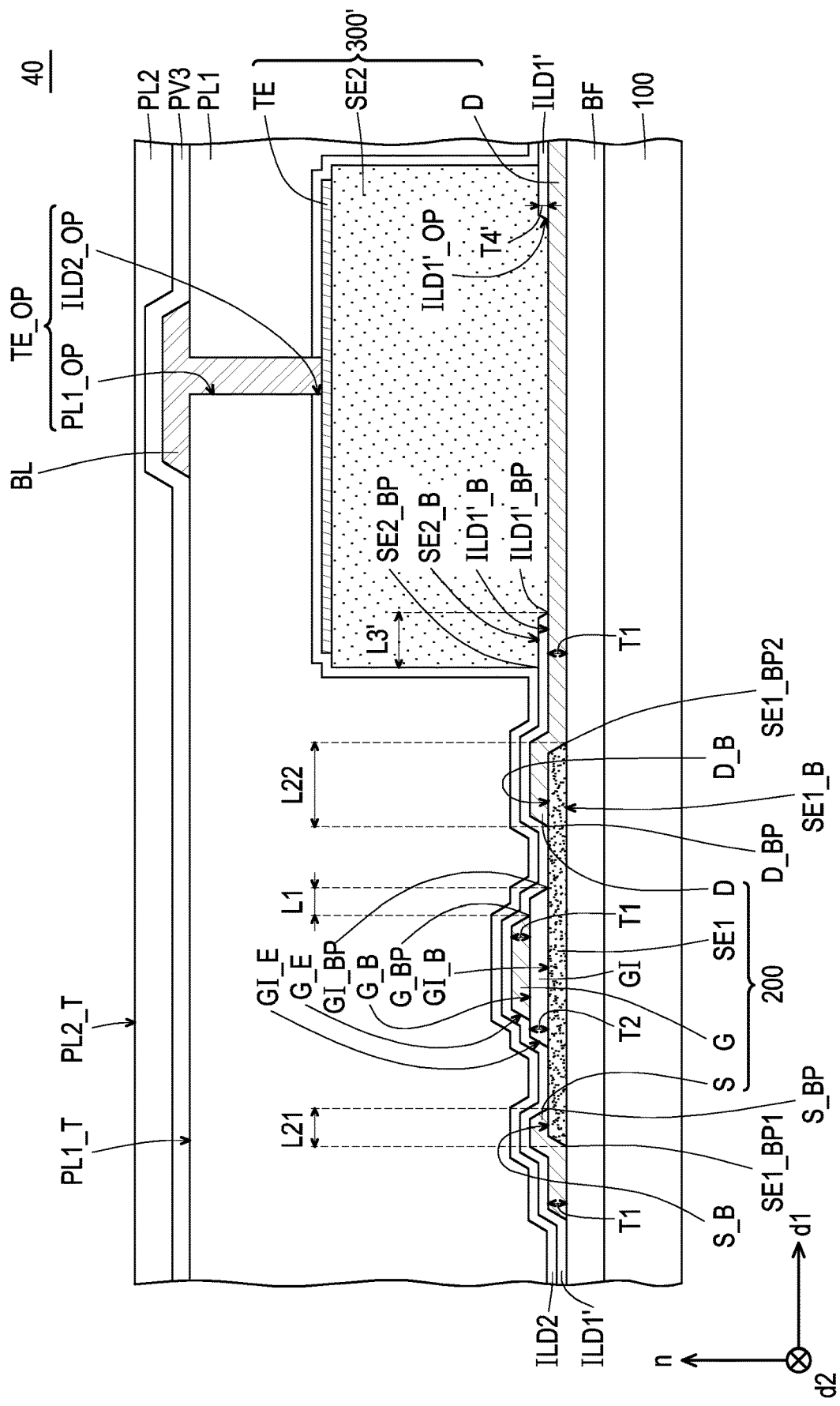
FIG. 5 is a schematic partial cross-sectional view of a detection device according to yet another embodiment of the disclosure.

FIG. 5 is a schematic partial cross-sectional view of a detection device according to yet another embodiment of the disclosure. It should be noted that the embodiment in FIG. 5 may continue to use the reference numerals and some content of the embodiment of FIG. 4, wherein the same or similar reference numerals are adopted to indicate the same or similar elements and the description of the same technical content is omitted.

Please refer to FIG. 5. The main difference between a detection device 40 of the embodiment and the detection device 30 is that the detection device 40 also includes an insulating layer ILD1'.

The insulating layer ILD1' is, for example, disposed between the semiconductor SE2 of the photosensitive element 300' and the drain D of the switch element 200, and exposes a part of the drain D. In detail, the insulating layer ILD1' has an opening ILD1'_OP exposing a part of the drain D, wherein the semiconductor SE2 of the photosensitive element 300' is disposed on the insulating layer ILD1' and may be coupled to the drain D through the opening ILD1'_OP, but the disclosure is not limited thereto.

In the embodiment, in the cross-sectional direction of the detection device 40, the insulating layer ILD1' overlaps with the semiconductor SE2 of the photosensitive element 300' by a length L3', wherein the length L3' may be between 0.5 microns and 6 microns, between 0.5 microns and 5 microns, between 1 micron and 5 microns, or between 1 micron and 4 microns. In the embodiment, the length L3' is a distance from an endpoint ILD1'_BP of a bottom surface ILD1'_B of the insulating layer ILD1' to the endpoint SE2_BP of the bottom surface SE2_B of the semiconductor SE2 in the cross-sectional direction of the detection device 40. Taking FIG. 5 as an example, the length L3' may be the distance from the endpoint ILD1'_BP of the bottom surface ILD1'_B of the insulating layer ILD1' to the endpoint SE2_BP of the bottom surface SE2_B of the semiconductor SE2 in the first direction d1, but the disclosure is not limited thereto. Through overlapping the insulating layer ILD1' with the semiconductor SE2 of the photosensitive element 300' by the above-mentioned length range, the insulating layer ILD1' may be suitable as an etch stop layer when forming the semiconductor SE2 of the photosensitive element 300' by etching, which may reduce the possibility of damaging a part of the drain D below the semiconductor SE2 due to etching, so as to reduce the sputtering of impurities (for example, metal ions) generated due to etching onto a side surface of the semiconductor SE2, thereby reducing the possibility of a leakage path being generated on the side surface of the semiconductor SE2, so as to improve the reliability of the detection device 40.

In some embodiments, a thickness T4' of the insulating layer ILD1' may be between 1000 angstroms and 3000 angstroms, but the disclosure is not limited thereto. The material of the insulating layer ILD1' may be, for example, the same as or similar to the material of the insulating layer ILD1, which will not be repeated here.

According to the above, the planarization layer in the detection device of the embodiment of the disclosure is disposed between the bottom electrode of the photosensitive element and the switch element. By using the planarization layer with better flatness, the photosensitive element may be configured to overlap with the switch element in the top view direction of the substrate, so that the surface area of the photosensitive element in the top view direction of the substrate is increased to have a higher fill factor, so as to improve the photoelectric conversion efficiency of the photosensitive element.

Furthermore, the part of the end portion of the gate insulating layer protruding from the adjacent end portion of the gate in the detection device of the embodiment of the disclosure is between 0.5 microns and 2.0 microns, which may reduce the diffusion of the hydrogen ions generated when forming the insulating layer by deposition into the semiconductor in the switch element, so as to improve the reliability of the detection device.

In addition, the gate, the source, and the drain of the switch element in the detection device of the embodiment of the disclosure may be formed by the same conductor layer, which may further improve the flatness of the photosensitive element disposed above the switch element, so as to improve the reliability of the detection device.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A detection device, comprising:
    a substrate;
    a switch element, disposed on the substrate and comprising a gate, a second semiconductor, a source, a drain, and a gate insulating layer, wherein the gate insulating layer is disposed between the gate and the second semiconductor;
    a photosensitive element, comprising a bottom electrode, a top electrode, and a first semiconductor disposed between the bottom electrode and the top electrode; and
    a planarization layer, disposed between the bottom electrode and the switch element,
    wherein the bottom electrode is coupled to the switch element,
    wherein the gate insulating layer is a block structure, and exposes a portion of the second semiconductor,
    wherein the block structure does not extend beyond the second semiconductor in a cross-sectional direction of the detection device,
    wherein in the cross-sectional direction of the detection device, a part of an end portion of the gate insulating layer protruding from an adjacent end portion of the gate has a first length, and the first length is between 0.5 microns and 2.0 microns.

2. The detection device according to claim 1, wherein the bottom electrode is disposed on the switch element, and in a top view of the detection device, the bottom electrode overlaps with the switch element.

3. The detection device according to claim 2, further comprising: a first insulating layer, disposed between the first semiconductor and the bottom electrode.

4. The detection device according to claim 3, wherein in the cross-sectional direction of the detection device, the first insulating layer overlaps with the first semiconductor by a second length, and the second length is between 0.5 microns and 6 microns.

5. The detection device according to claim 3, wherein the first insulating layer has an opening exposing a part of the bottom electrode.

6. The detection device according to claim 3, wherein a thickness of the first insulating layer is between 1000 angstroms and 3000 angstroms.

7. The detection device according to claim 1, wherein the gate, the source, and the drain are formed by the same conductor layer.

8. The detection device according to claim 7, wherein the second semiconductor comprises an oxide semiconductor.

9. The detection device according to claim 7, wherein in the cross-sectional direction of the detection device, at least one of the source and the drain overlaps with the second semiconductor by a third length, and the third length is between 0.5 microns and 4 microns.

10. The detection device according to claim 7, wherein a maximum thickness of the gate is between 500 angstroms and 1500 angstroms.

11. The detection device according to claim 7, wherein a minimum thickness of the gate insulating layer is between 500 angstroms and 2000 angstroms.

12. The detection device according to claim 7, wherein a thickness of the planarization layer is between 1 micron and 2 microns.

* * * * *